United States Patent [19]
Carter, Jr. et al.

[11] Patent Number: 6,072,230
[45] Date of Patent: Jun. 6, 2000

[54] EXPOSED LEADFRAME FOR SEMICONDUCTOR PACKAGES AND BEND FORMING METHOD OF FABRICATION

[75] Inventors: Buford H. Carter, Jr., Richardson; Jesse E. Clark, Carrollton; David R. Kee, Richardson, all of Tex.

[73] Assignee: Texas Instruments Incorporated, Dallas, Tex.

[21] Appl. No.: 08/926,150

[22] Filed: Sep. 9, 1997

[51] Int. Cl.[7] .......................... H01L 23/495; H01L 23/48
[52] U.S. Cl. .......................... 257/666; 257/667; 257/668; 257/669; 257/676
[58] Field of Search .................................... 257/666, 667, 257/668, 669, 676

[56] References Cited

U.S. PATENT DOCUMENTS

| | | | |
|---|---|---|---|
| 4,496,965 | 1/1985 | Orcutt et al. | 257/666 |
| 5,455,462 | 10/1995 | Marrs | 257/796 |
| 5,789,806 | 8/1998 | Chua et al. | 257/676 |

*Primary Examiner*—Leo P. Picard
*Assistant Examiner*—Hung Van Duong
*Attorney, Agent, or Firm*—Gary C. Honeycutt

[57] ABSTRACT

The invention relates to a single piece leadframe that can be used in current semiconductor device production. The leadframe has a plurality of segments in a horizontal plane, a chip mount pad in a different horizontal plane, and another plurality of segments connecting said chip mount pad with said leadframe. The latter plurality of segments has a geometry designed so as to tolerate bending and stretching beyond the limit of simple elongation based upon the inherent material characteristics. The chip mount pad of said leadframe provides direct thermal contact to an external heat conductor or heat sink by being designed so as to extend through the encapsulating package. The exposed chip pad can also be used electrically as a ground connection.

15 Claims, 6 Drawing Sheets

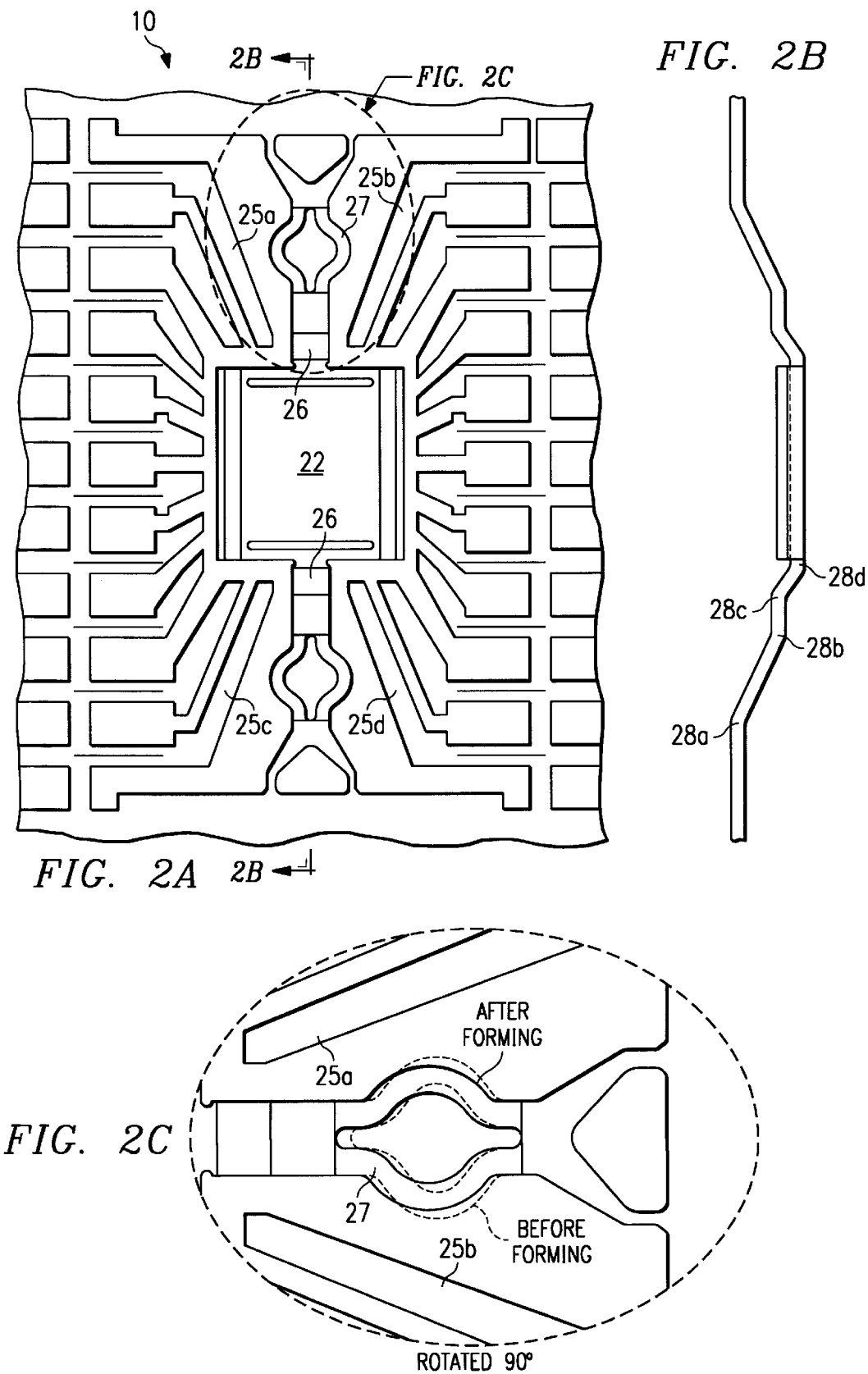

EXPOSED LEADFRAME FOR SEMICONDUCTOR PACKAGES AND BEND FORMING METHOD OF FABRICATION

FIELD OF THE INVENTION

This invention relates to the design and fabrication of leadframes for semiconductor devices, the packaging of said devices, and more particularly to the bending and forming of certain segments of said leadframe, whereby the exposure of the chip mount pad at one face of the package is enabled under difficult design constraints.

BACKGROUND OF THE INVENTION

Power semiconductor devices and other integrated circuit devices which dissipate high power, or are used in high frequency telecommunications, have been prepared in the past using an exposure to the ambient of part of their leadframe to dissipate heat produced by the devices, and to provide electrical RF ground for the device. One such approach is described in U.S. Pat. No. 5,594,234, dated Jan. 14, 1997, to which this invention is related. Semiconductor devices produced with this known technology are typically based on leadframes which include a first plurality of segments in a first horizontal plane and a chip mount pad in a second horizontal plane such that the distance between these two planes is relatively short and can be bridged by a second plurality of segments without difficulty. Due to the inherent characteristics of the leadframe materials, especially their tolerance for stretching, this distance has been so short, or under such shallow angle that semiconductor devices with exposed chip mount pads produced by known technology are restricted to low profile packages (thickness 1.0 mm or less). On the other hand, standard thickness packages, standard small-outline wide-body packages, and PowerPAD™ devices are routinely required in electronics equipment and applications. In addition, many applications ask for low-profile packages with minimum area requirements, but exposed leadframe. These demands cannot be satisfied by known technology.

SUMMARY OF THE INVENTION

The invention relates to a leadframe for use with semiconductor devices, including a first plurality of leadframe segments in a first horizontal plane, a chip mount in a second horizontal plane, and a second plurality of leadframe segments connecting said chip mount pad with said leadframe. Said second plurality of segments has a geometry designed so that the segments can accommodate bending and stretching in the lead frame forming process beyond the limit of simple elongation based upon inherent material characteristics. Said chip mount pad extends to and through the encapsulating plastic package.

It is an object of the present invention to extend the concept of exposed leadframe for thermal dissipation to semiconductor packages of standard thickness.

Another object of the present invention is to provide a method to form the leadframe through bending and stretching beyond the limit of simple elongation based upon inherent material characteristics.

Another object of the present invention is to provide a method for wide leadframe design flexibility and for a wide range of leadframe materials.

Another object of the present invention is to provide a method applicable to various semiconductor device families in digital signal processing, mixed signals, microprocessors, application-specific products and other commercial and military applications requiring flexibility, high power and high signal capabilities, high reliability, and cost-effectiveness.

Another object of the present invention is to provide a method applicable to various semiconductor package types, including small outline packages, quad flat packs, high frequency and power surface mount packages.

These objects have been achieved by correlating linear geometries, forming angles, material thickness, material characteristics, and stretch needed. These combinations have been employed for the fabrication of exposed leadframe packages of standard thickness, high power, as well as high frequency.

The technical advance represented by the invention, as well as the objects thereof, will become apparent from the following description of a preferred embodiment of the invention when considered in conjunction with the accompanying drawings, and the novel features set forth in the appended claims.

BRIEF DESCRIPTION OF THE DRAWINGS

FIG. 2A is a top view of a redesign of the leadframe in FIG. 1A, before and after the leadframe forming process.

FIG. 2B is a side view of the leadframe in FIG. 2A along line 2B—2B, after the forming process.

FIG. 2C is a detail of the segment toroids in FIG. 2A, showing the toroid before and after the forming process.

DESCRIPTION OF THE PREFERRED EMBODIMENTS

Figures 1A, 1B:
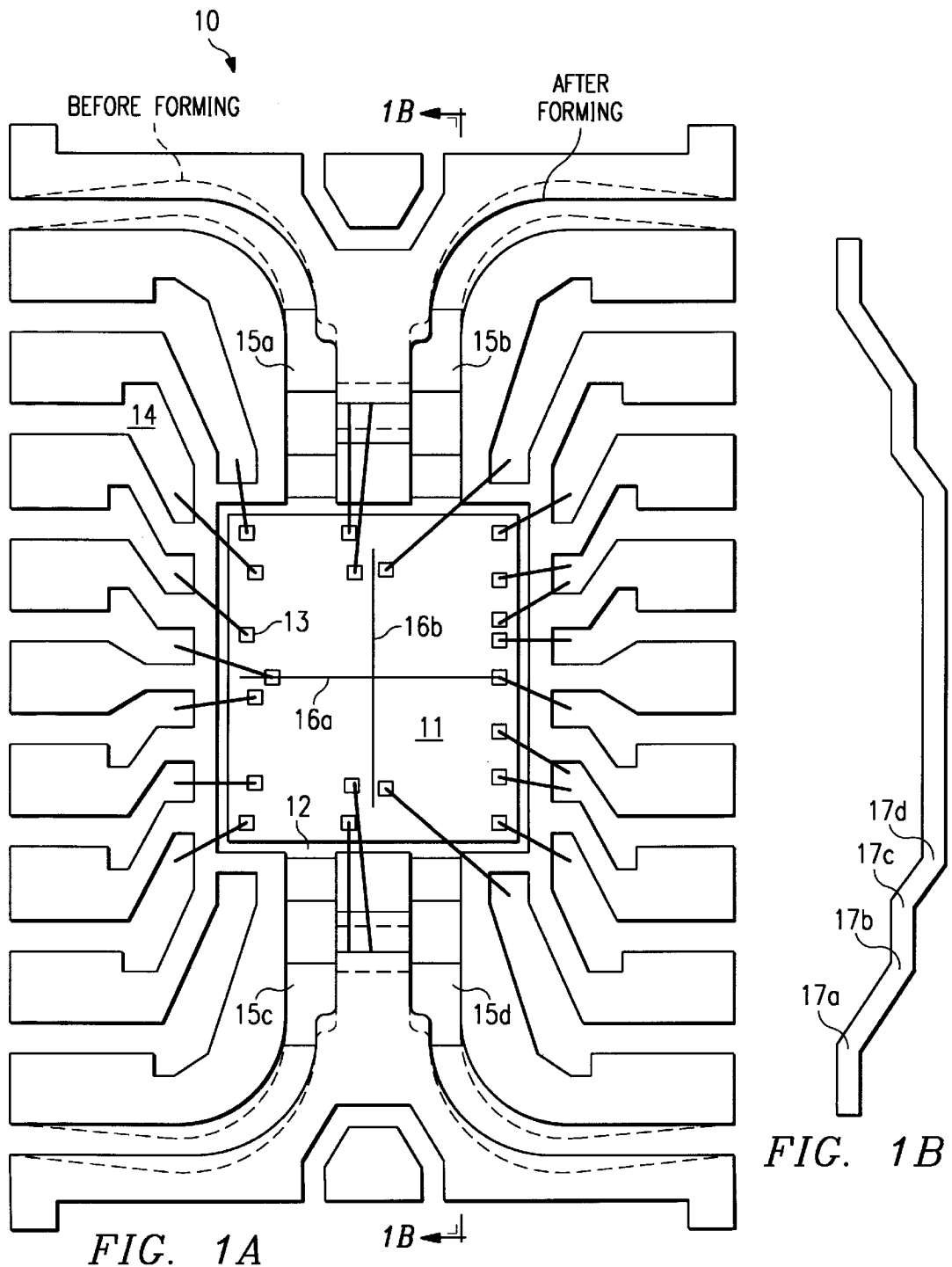
FIG. 1A is a top view of a semiconductor leadframe according to a first embodiment of the invention, before and after the leadframe forming process.
FIG. 1B is a side view of the leadframe in FIG. 1A, along line 1B—1B, after the forming process.

The invention as described in FIGS. 1 to 4, relates to a single piece semiconductor leadframe that can be used in current production processes and installed equipment base. The single piece leadframe has a chip mount pad that is formed so that it is in a plane, into which the semiconductor chip is mounted, different from the plane of the plurality of lead segments. A second plurality of segments has been designed, bent and formed to support so that they enable the considerable distance of said planes in standard thickness semiconductor devices.

The leadframe for semiconductor devices was invented (U.S. Pat. Nos. 3,716,764 and 4,043,027) to serve several needs of semiconductor devices and their operation simultaneously: First of all, the leadframe provides a stable support pad for firmly positioning the semiconductor chip. Since the leadframe including the pad is made of electrically conducting material, the pad may be biased, when needed, to any electrical potential required by the network involving the semiconductor device, especially the ground potential. Secondly, the leadframe offers a multitude of conductive segments to bring various electrical conductors into close proximity of the chip. The remaining gap between the tip or the segments and the conductor pads on the circuit surface are typically bridged by thin wires, individually bonded to the chip contact pads and the leadframe segments (wire bonding).

For reasons of easy and cost-effective manufacturing it has been common practice to manufacture single piece leadframes from thin sheets of metal such as copper (typical thickness range 120 to 250 $\mu$m). The desired shape o the leadframe is etched or stamped from this original sheet. In this manner, an individual segment of the leadframe takes the form of a thin metallic strip with its particular geometric shape determined by the design. For most purposes, the length of a typical segment is considerably longer than its width. Furthermore, in the early years of this development, all segments of the leadframe remained in one horizontal plane, namely the plane of the starting sheet of metal.

For technical reasons of wire bonding, though, it soon became desirable to position the chip mount pad in a horizontal plane slightly offset (about 10 to 20 $\mu$m) from the plane of the segments. Consequently, those few segments which connect the chip mount pad with the leadframe now have to he slightly formed to accommodate the required step between the two planes. This forming is accomplished by an outside force acting on those segments. As a result, those segments become a plurality separate from the original plurality of the majority of the segments. The mechanical rigidity of the chip mount pad remains unchanged.

For manufacturing leadframes in mass production, the complete pattern of chip pad, segments and support structures is first stamped or etched out of the original flat thin sheet metal; typical thicknesses are 0.25 or 0.15 mm. Starting materials include, but are not limited to, copper, copper alloys, iron-nickel alloys, and invar. Then, major parts of the leadframe are clamped in one horizontial plane, while force is applied to the chip pad in order to press it into its new horizontal plane. The segments supporting the chip pad have to absorb this force by stretching; they are "pressed" into their final geometrical shape.

By way of explanation, an outside force, applied along the length of the segment, can stretch the segment in the direction of the length, while the dimension of the width is only slightly reduced, so that the new shape appears elongated. For elongations small compared to the length, and up to a limit, called the elastic limit given by the material characteristics, the amount of elongation is linearly proportional to the force. Beyond that elastic limit, the segment suffers irreversible changes and damage to its inner strength and will eventually break.

With the advent of leadframes exhibiting chip mount pads extending to and through the encapsulating material surrounding portions of the leadframe segments and the semiconductor chip ("exposed chip mount pad leadframes", for example U.S. Pat. No. 5,594,234) for surface-mount packages, the direct distance between the horizontal plane of the chip mount pad and the horizontal plane of the segments increases significantly. This direct distance then falls in the range of about 400 to 500 $\mu$m for so-called "thin" packages, that is packages with a final thickness of 1.0 mm or less. However, this challenge can usually be met while staying within the limits of material characteristics, if the distance is bridged by the segment at an inclination angle of 30° or less. For instance, with copper as basic element of the sheet material for the leadframes (thickness range 120 to 250 $\mu$m), appropriate alloys combined with suitable thermal treatment can be selected so that leadframes can he designed with straight segments capable of sustaining forced stretches to cover that distance at "shallow" angles (30° or less). If necessary, a multi-step configuration at angles of 40° or less can be adopted for covering that distance. As a side benefit, this configuration enhances mold locking of plastic to the leadframe in transfer molded plastic packages.

The exposed chip mount pad provides a direct thermal path from the chip to an external heat dissipator, thus strongly enhancing the thermal capabilities of power devices. Other advantages include an electrically conductive exposed RF ground plane (important for high frequency devices), a reduction in package height, the elimination of the bottom layer of plastic conventional plastic packages, and the removal of the susceptibility of the bottom plastic to form reliability hazards in moist environments. Consequently, there exists strong motivation to expand the concept of exposed chip mount pad leadframes to surface-mount packages of so-called "standard" thicknesses larger than 1.0 mm. In order to apply this concept, however, drastic changes in that concept are required for those devices, since the direct distance between the horizontal plane of the chip mount pad and the horizontal plane of the segments increases up to 260% over the respective distance in "thin" packages (into the 1100 to 1200 $\mu$m range). For standard thickness packages, a copper segment elongation of more than 8% would be required, which is beyond the elastic limit of copper leadframe materials and would result in segment cracking and breaking.

Similar difficulties arise in "thin" packages (1.0 mm thickness or less) when the direct distance of 400 to 500 $\mu$m between the planes of the chip pad and the leadframe has to he bridged at angles steeper then 30°, for instance 45°. This steep angle is a consequence of the desire to shrink the outline of a package (that is the area it consumes when mounted on a printed wiring board) as much as possible, or to accommodate an extra large chip pad in a given package. Here again a copper segment elongation of more than 8% would be required, which is beyond the elastic limit of copper leadframe materials. Such thin semiconductor packages are in demand by markets such as disk drives, telecommunications and consumer electronics.

The invention solves this dilemma by substituting a twofold approach for the elongation-only solution: Linearizing a design in bending, and stretching through forming. The contribution of linearizing can be obtained when a topologically long body is first designed so that it contains curves, bendings, meanderings or similar non-linearities. By applying force, at least part of the non-linearities is stretched or straightened so that afterwards the body is elongated. This can be visualized in the familiar action that an arm, angled at the elbow, will be lengthened when the lower arm is stretched to get in line with the upper arm.

The contribution of stretching is similar to the elongation in the direction of the segment length discussed above. This stretching, therefore, will remain safely below the elastic limit of the leadframe material. The nature and effect of both contributions will become more readily understood from the following description of the illustrations.

Referring now to FIG. 1A, a copper alloy leadframe 10 for a thermal test chip is shown from top view, with the chip 11 mounted on the mount pad 12, and the plurality of chip contact pads 13 wire bonded to the plurality of leadframe segments 14. Leadframe 10 and the plurality of segments 14 lay in the original plane of the leadframe. The four segments 15a, 15b, 15c, and 15d connect the chip mount pad 12 to the leadframe 10. The latter plurality is shown in two stages: Dashed lines indicate the original design, marking the shape of the segments in the original plane of the leadframe, before applying force for forming the chip mount pad 12 into its final plane. As FIG. 1A shows, those segments are designed in a shape much more curved than would be necessary for "shortest connection". The solid lines indicate the final shape of the segments after applying force for bending and stretching. The cross section along lines 1B—1B shows the multiple bendings and steps of these segments to elongate them in three dimensions for traversing the distance between the horizontal plane of the chip mount pad and the original horizontal plane of the leadframe.

Even given the relatively shallow forming angle of 30° in this example, the total elongation of each segment 15a, 15b, 15c, and 15d, which is needed to traverse the final distance from the chip pad plane to the leadframe plane, requires about 15.5% additional segment length to he added to the original length. Since the stretching of the material proper (copper alloy) can contribute only 8% to this additional length, the remaining more than 7% has to be obtained from straightening the designed-in curved shape of the segments. In the example of FIG. 1A, the stretching of said segments is reminiscent of stretching an arm angled at the elbow. Had the angle of forming be selected steeper than in this example—for instance 45°, which is often desirable-, then the contribution to be gained from straightening/bending of the designed-in shape would have to increase to more than 33% (for 45° angle straightening must contribute 41.4%–8%=33.4% additional length). These numbers vary somewhat with the thickness of the leadframe, and also with composition and thermal pre-treatment of the base material.

Cross section 1B—1B indicates the multiplicity of bendings 17a, 17b, 17c, and 17d, as indicated in FIG. 1B; they have been designed and pressed at relatively shallow angles.

FIG. 1A illustrates a four-fold symmetry of layout in the leadframe design, as indicated by the symmetry lines 16a and 16b. This symmetry and similar ones in the following FIGURES derive from practical aspects of cost-effective design layout and wire bonding constraints to the chip contact pads.

FIG. 2 shows a redesign of leadframe 10 in FIG. 1A, now in two-fold symmetry, for the purpose of making even leads 25a, 25b, 25c, and 25d available for electrical signal functions. Consequently, chip pad 22 is now supported by segments 26, which have been designed with sections shaped as a toroid 27. In FIG. 2C, toroids 27 are shown by dashed lines in their original design before the forming process, and by solid lines in their final shape after the forming process. The contribution for achieving the additional length of the segments from straightening the designed-in curved shape of the toroids is evident. In FIG. 2B, the cross section of the leadframe indicates the multiplicity of bendings 28a, 28b, 28c, and 28d after the forming process.

Figure 3A:
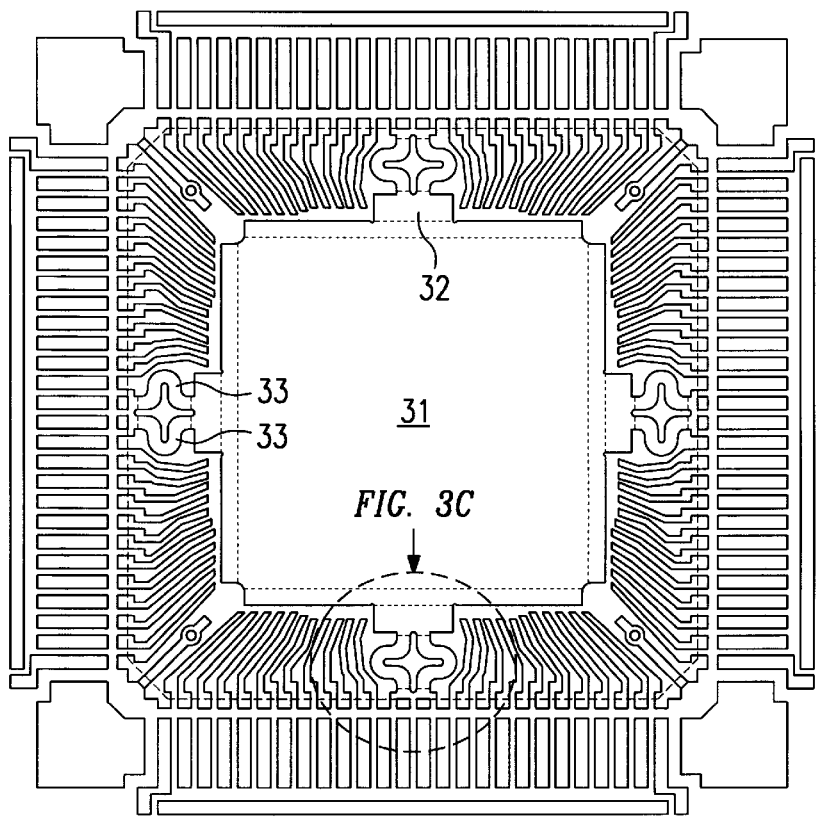
FIG. 3A is a top view of a leadframe according to a second embodiment of the invention.
Figure 3B:
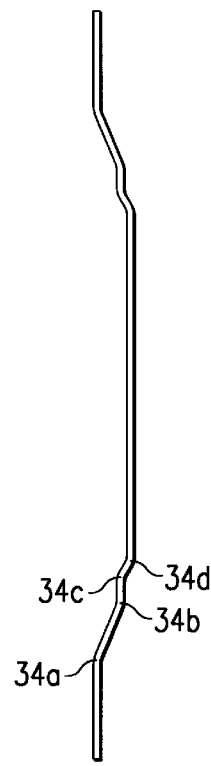
FIG. 3B is a side view of the leadframe in FIG. 3A along line 3B—3B, after the forming process.
Figure 3C:
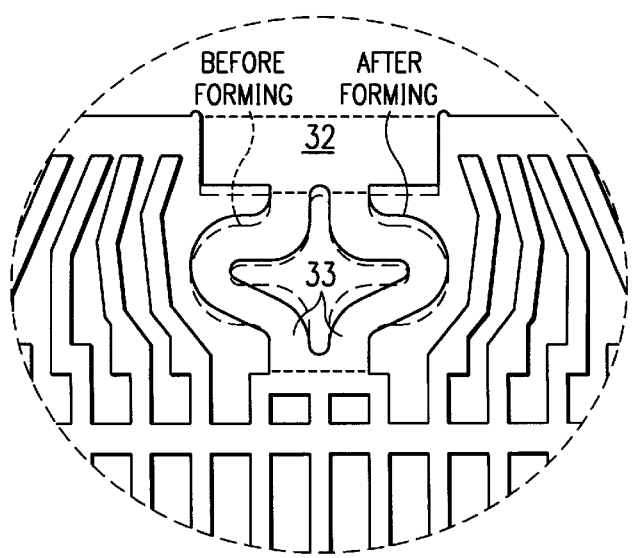
FIG. 3C is a magnified detail of the segment toroids in FIG. 3A, showing the tortoid before and after the forming process.

FIGS. 3A to 3C and FIG. 4A to 4C show examples of leadframes for so-called Quad Flat Packages of relatively high lead counts (100 leads and 44 leads respectively). The design options selected in FIGS. 3A to 3C and FIGS. 4A to 4C for the segments connecting chip pad and leadframe consist of toroids of various construction. In FIG. 3A, the multitude of segments 32 connecting the chip pad 31 with the leadframe 30 is positioned on the sides of the chip pad, and the toroids 33 are part of said segments. FIG. 3B shows the multiplicity of bendings 34a, 34b, 34c, and 34d at relatively shallow angles. FIG. 3C indicates one of the toroidal segments 33 in more detail; it is shown by dashed lines in its original design before the forming process, and by solid lines in its final shape after the forming process. The significant contribution from straightening the designed-in curved shape of the toroid is clearly visible for achieving the additional length of the segment.

Figure 4A:
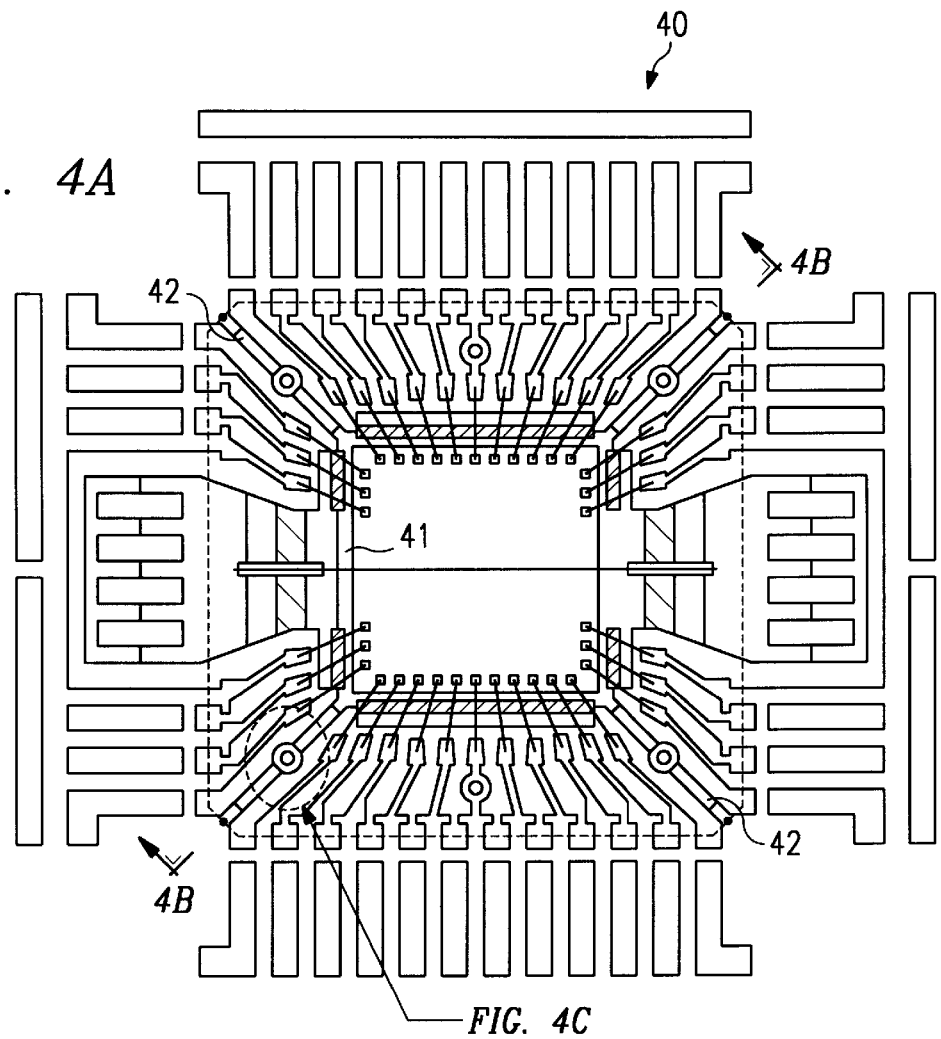
FIG. 4A is a top view of a leadframe according to a third embodiment of the invention.
Figure 4C:
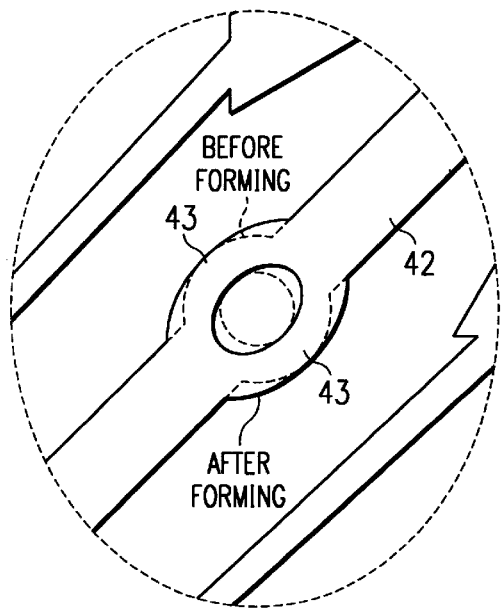
FIG. 4C is a magnified detail of the segment torioids in FIG. 4A, showing the toroid before and after the forming process.
Figure 4B:
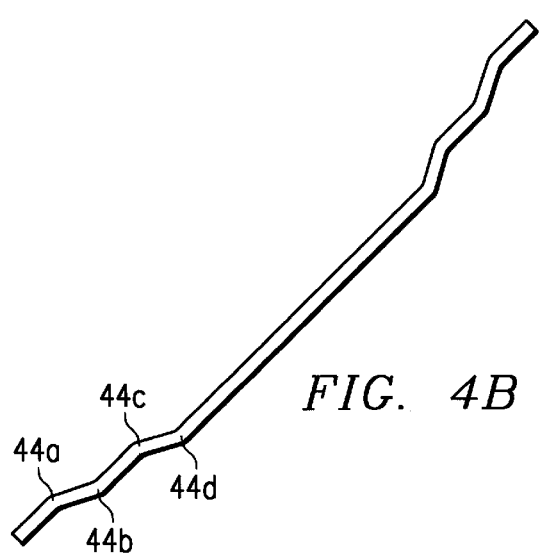
FIG. 4B is a side view of the leadframe in FIG. 4A along line 4B—4B, after the forming process.

In FIG. 4A the multitude of segments 42 connecting the chip pad 41 with the leadframe 40 is positioned in the corners of the chip pad, and the toroids 43 are again part of said segments. FIG. 4B shows the bendings 44a, 44b, 44c, and 44d of the segments, and FIG. 4C illustrates the straightening of the toroid 43 after the forming process. Again, the straightening of the designed-in curved shape of the toroid is essential for achieving the additional length of the segment.

Figure 5A:
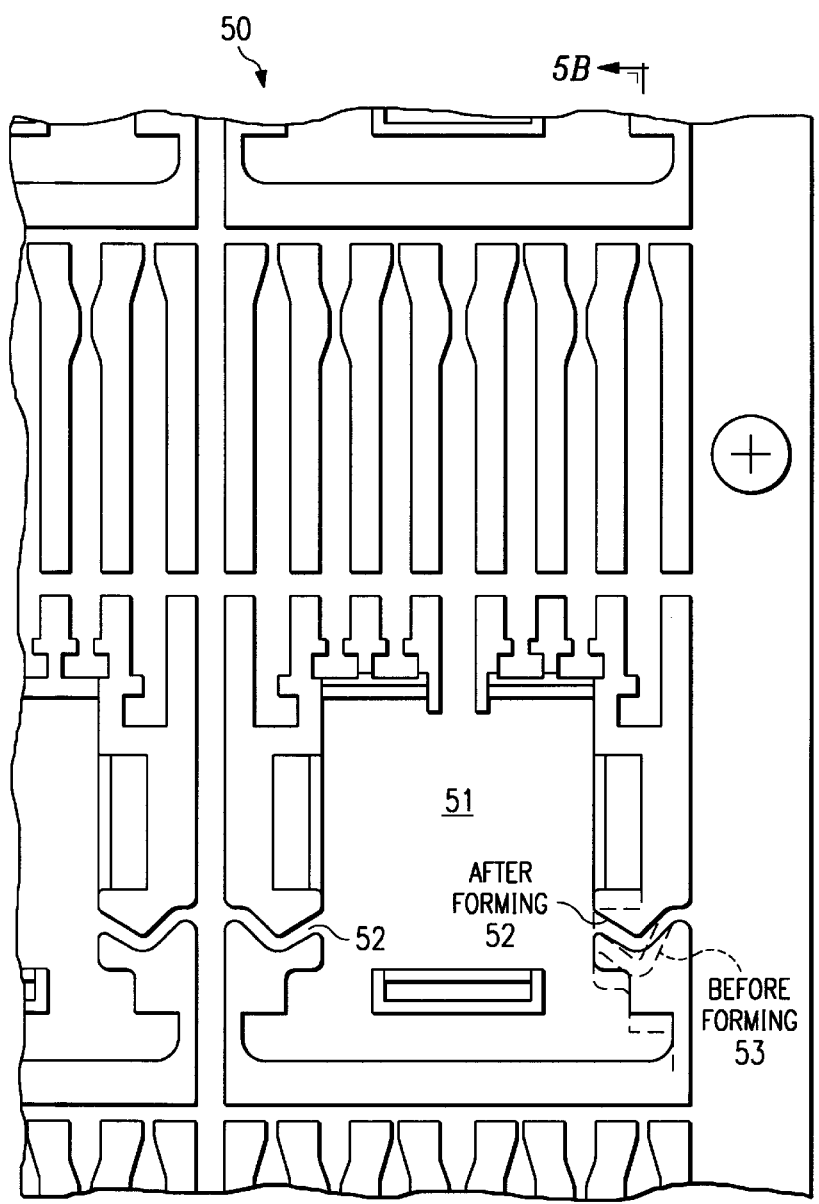
FIG. 5A is a top view of a leadframe according to another embodiment of the invention, before and after the leadframe forming process.
Figure 5B:
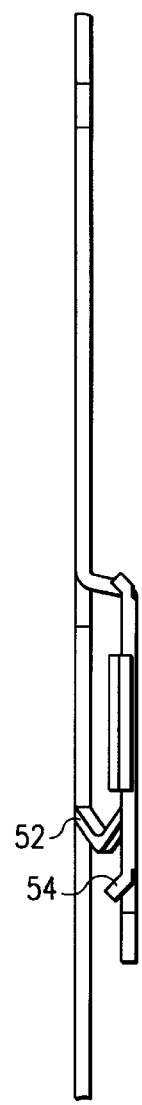
FIG. 5B is a side view of the lead frame in FIG. 5A after the forming process.
Figure 6A:
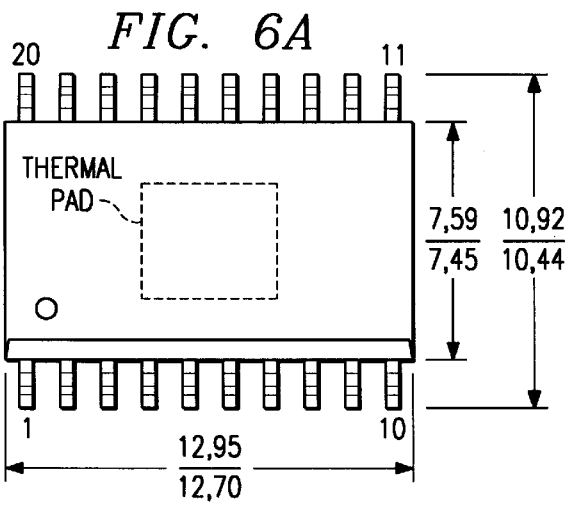
FIG. 6A, 6B, and 6C are different views of a plastic package of the small outline type of standard thickness and with exposed chip pad, having a leadframe fabricated by the bending and forming method.
Figure 6C:
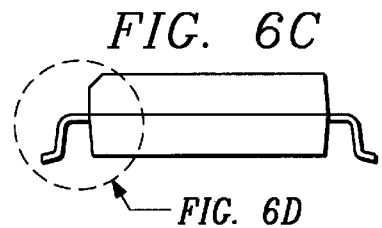
Figure 6B:
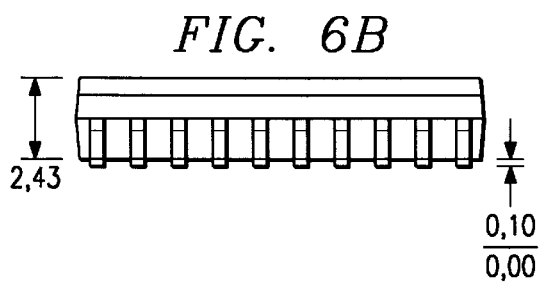
Figure 6D:
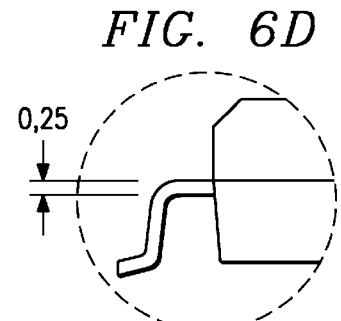
FIG. 6D is a magnified detail of a portion of FIG. 6C.
Figure 7A:
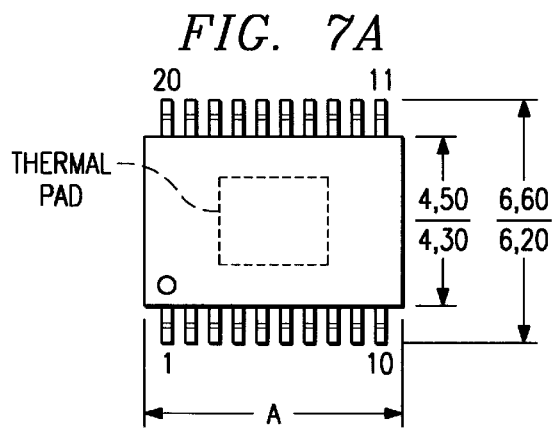
FIG. 7A, 7B, and 7C are different views of a plastic power package of the small outline type of "thin" thickness, exposed chip pad and minimum area consumption, having a leadframe fabricated by the bending and forming method.
Figure 7C:
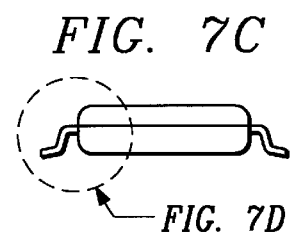
Figure 7B:
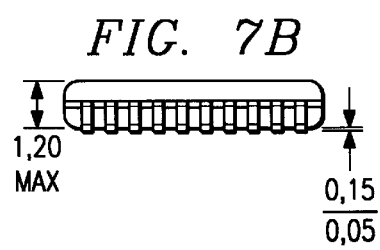
Figure 7D:
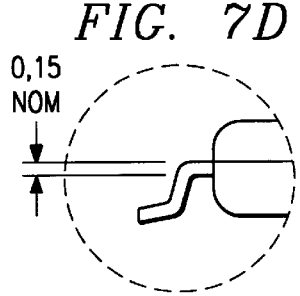
FIG. 7D is a magnified detail of a portion of FIG. 7C.

FIG. 5A is an example of a leadframe 50 for a power device with low lead count. There is only one symmetry line in the leadframe example of FIG. 5A. The sideview in FIG. 5B is not following this symmetry line, but rather intends to illustrate the steep angle of the segments 52 connecting the chip mount pad 51 with the leadframe 50; also shown are notched wings 54 extending from the chip mount pad. In the forming process, the designed-in curved shape 53 of the connecting segments is straightened considerably, reminiscent of stretching an arm angled at the elbow.

With this designed-in capability of bending and stretching selected leadframe segments beyond the limit of simple elongation based upon inherent material characteristics, leadframes with exposed chip pads can be manufactured for semiconductor devices with features which cannot be achieved with the capability of known technology. First of all, plastic packages of standard thickness (>1.0 mm) can now be fabricated with exposed chip pads because their leadframes according to the invention allow a wide distance between chip pad and leadframe. Secondly, thin plastic packages (<1.0 mm thickness) with very stringent outline constraints can now be fabricated with exposed chip pads because selected leadframe segments according to the invention allow bending and stretching in steep-angled contour to bridge the distance between chip pad and leadframe. As a further benefit of the bending and forming method of the invention, the leadframe material retains considerable elasticity for the assembly and packaging process steps following after chip attach and wire bonding, since it has been formed well below its elastic limit; elastic quality equates to improved tolerance for process variations and higher process yield.

Numerous designs of leadframes for various families of semiconductor products, covering low to high lead counts, low to high power distribution, and low to high frequency capabilities, are incorporating the concept of the invention. As an example, FIG. 6 shows a plastic small outline package of 2.43 mm thickness. It uses a copper leadframe of 0.25 mm thickness with an exposed chip pad and a plurality of gull wing leads. The leadframe exhibits a wide separation of chip mount pad from the plane of the lead segments and thus uses the bending and forming method of the invention for the design and the production of the leadframe.

FIG. 7 illustrates a "thin" (approximately 1.0 mm thick) plastic small-outline package with exposed chip pad. Its copper alloy leadframe is 0.15 mm thick and requires considerably more than 30° bending to bridge the distance between the chip pad and the leadframe within the small dimension permitted by the package type. Consequently, its design includes a toroidal shape of the leadframe segments holding the chip pad to the leadframe, and uses the bending and forming method of this invention.

What is claimed is:

1. A leadframe for use with semiconductor circuits, comprising:

a first plurality of leadframe segments in a first horizontal plane;

a chip mount pad in a second horizontal plane; and a second plurality of leadframe segments connecting said chip mount pad with said leadframe, having a geometry designed to accommodate elongation in a direction that lies substantially within the plane of said second segments, beyond the limit of simple elongation based upon inherent material characteristics.

2. The leadframe according to claim 1 wherein said geometry design contributes 50 to 500% over the contribution of said material elongation to the segment stretching.

3. The leadframe according to claim 1 wherein said second plurality of leadframe segment has curved geometry.

4. The leadframe according to claim 1 wherein said second plurality of leadframe segments has toroidal geometry.

5. The leadframe according to claim 1 wherein said second plurality of leadframe segments can accommodate a multiplicity of bendings.

6. A leadframe as in claim 1 wherein the mechanical stability and rigidity of the chip mount pad is maintained by said second segments, during and after said bending and stretching.

7. A leadframe as in claim 1 wherein the portions location of boundable and stretchable of said second segments allow bond wire lengths, between the leadframe finger tips and the chip, to remain substantially unchanged.

8. A leadframe for use with semiconductor circuits, comprising:

a first plurality of leadframe segments in a first horizontal plane;

a chip mount pad in a second horizontal plane; and a second plurality of leadframe segments connecting said chip mount pad with selected members of said first plurality of leadframe segments, said second plurality having a geometry designed to accommodate bending and stretching beyond the limit of simple elongation based upon inherent material characteristics.

9. A semiconductor device comprising:

a first plurality of leadframe segments in a first horizontal plane;

a chip mount pad in a second horizontal plane;

a second plurality of leadframe segments connecting said chip mount pad with said leadframe having been formed by bending and stretching substantially within the plane of said second segments, beyond the limit of simple elongation based upon inherent material characteristics;

a circuit chip mounted on said chip mount pad; and an encompassing package encapsulating a portion of the leadframe leads, the circuit chip, and a portion of said chip mount pad, said chip mount pad extending to and through said package, to provide an exposed chip pad.

10. The semiconductor device according to claim 9 wherein said chip mount pad provides a direct thermal path to said circuit chip.

11. The semiconductor device according to claim 9 wherein said chip mount pad serves as a heat convection surface for said circuit chip.

12. The semiconductor device according to claim 9 wherein the leadframe leads outside of the encapsulating package are formed to place the chip pad extending through the top side of the semiconductor device package when the package is mounted on a printed wiring board.

13. The semiconductor device according to claim 9, in combination with a printed circuit board, and a heat dissipating device in thermal contact with said exposed chip pad.

14. A leadframe as in claim 9 wherein the mechanical stability and rigidity of the chip mount pad is maintained by said second segments, during and after said bending and stretching.

15. A leadframe as in claim 9 wherein the portions location of boundable and stretchable of said second segments allow bond wire lengths, between the leadframe finger tips and the chip, to remain substantially unchanged.

* * * * *